(12) United States Patent
Hu et al.

(10) Patent No.: US 11,165,023 B2
(45) Date of Patent: Nov. 2, 2021

(54) DISPLAY SUBSTRATE, METHOD OF MANUFACTURING DISPLAY SUBSTRATE, DISPLAY PANEL, AND MASK

(71) Applicants: Hefei BOE Joint Technology Co., Ltd., Anhui (CN); BOE TECHNOLOGY GROUP CO., LTD., Beijing (CN)

(72) Inventors: Yue Hu, Beijing (CN); Chinlung Liao, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/815,848

(22) Filed: Mar. 11, 2020

(65) Prior Publication Data

US 2021/0074921 A1   Mar. 11, 2021

(30) Foreign Application Priority Data

Sep. 9, 2019 (CN) .......................... 201910848604.4

(51) Int. Cl.
*H01L 51/00* (2006.01)
*H01L 27/32* (2006.01)
(Continued)

(52) U.S. Cl.
CPC ...... *H01L 51/0023* (2013.01); *H01L 27/3246* (2013.01); *H01L 51/0005* (2013.01);
(Continued)

(58) Field of Classification Search
CPC ............. H01L 51/0023; H01L 51/0005; H01L 51/5206; H01L 51/0022; H01L 51/5088;
(Continued)

(56) References Cited

U.S. PATENT DOCUMENTS

| 7,015,503 B2 | 3/2006 | Seki et al. |
| 7,214,959 B2 | 5/2007 | Seki et al. |

(Continued)

FOREIGN PATENT DOCUMENTS

| CN | 101005125 A | 7/2007 |
| CN | 107026187 A | 8/2017 |

(Continued)

OTHER PUBLICATIONS

First Office Action, including Search Report, for Chinese Patent Application No. 201910848604.4, dated May 28, 2021, 18 pages.

*Primary Examiner* — Kyoung Lee
(74) *Attorney, Agent, or Firm* — Westman, Champlin & Koehler, P.A.

(57) ABSTRACT

Embodiments of the present disclosure provide a method of manufacturing a display substrate. The method includes: forming a first electrode layer on a substrate, the first electrode layer including a plurality of first electrodes arranged in an array; performing a surface treatment on the plurality of first electrodes, such that an affinity of a surface of each of the plurality of first electrodes gradually increases from a central portion of the surface to a peripheral portion of the surface around the central portion, or the affinity of the central portion of the surface is less than the affinity of the peripheral portion of the surface; and forming a light emitting functional layer on the surfaces of the plurality of first electrodes subjected to the surface treatment. Embodiments of the present disclosure further provide a display substrate, a display panel, and a mask.

19 Claims, 5 Drawing Sheets

(51) Int. Cl.
*H01L 51/50* (2006.01)
*H01L 51/52* (2006.01)
*H01L 51/56* (2006.01)

(52) U.S. Cl.
CPC ...... *H01L 51/0022* (2013.01); *H01L 51/5088* (2013.01); *H01L 51/5206* (2013.01); *H01L 51/56* (2013.01); *H01L 2251/308* (2013.01)

(58) Field of Classification Search
CPC ................ H01L 27/3246; H01L 51/56; H01L 2251/308
See application file for complete search history.

(56) References Cited

U.S. PATENT DOCUMENTS

| | | | |
|---|---|---|---|
| 7,273,801 B2 | 9/2007 | Seki et al. | |
| 7,442,955 B2 | 10/2008 | Seki et al. | |
| 7,932,518 B2 | 4/2011 | Seki et al. | |
| 10,573,707 B2 | 2/2020 | Sun | |
| 10,892,435 B2 | 1/2021 | Lee et al. | |
| 10,957,751 B2 | 3/2021 | Hu | |
| 2004/0201048 A1 | 10/2004 | Seki et al. | |
| 2005/0170076 A1 | 8/2005 | Seki et al. | |
| 2005/0170550 A1 | 8/2005 | Seki et al. | |
| 2005/0186403 A1 | 8/2005 | Seki et al. | |
| 2007/0012950 A1 | 1/2007 | Cain et al. | |
| 2009/0020751 A1 | 1/2009 | Seki et al. | |
| 2015/0060827 A1* | 3/2015 | Sasaki | H01L 27/322 257/40 |
| 2019/0131373 A1 | 5/2019 | Sun | |
| 2019/0207140 A1 | 7/2019 | Lee et al. | |
| 2021/0020711 A1 | 1/2021 | Hu | |

FOREIGN PATENT DOCUMENTS

| | | |
|---|---|---|
| CN | 107527939 A | 12/2017 |
| CN | 107731879 A | 2/2018 |
| CN | 107799673 A | 3/2018 |
| CN | 108258154 A | 7/2018 |
| CN | 109994644 A | 7/2019 |

* cited by examiner

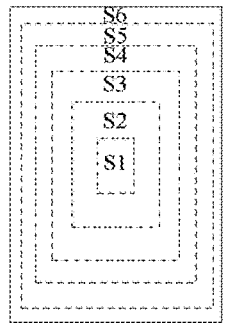

FIG. 5

| Sequentially form a first electrode layer and a pixel defining layer on a substrate, the first electrode layer including a plurality of first electrodes arranged in an array, the pixel defining layer being formed with a plurality of openings arranged in an array, and each of the plurality of openings exposing one of the first electrodes | S100 |

↓

| Perform an ultraviolet radiation treatment on the first electrodes while the first electrode layer is shielded with a mask, such that an affinity of a surface of each of the first electrodes gradually increases from a central portion of the surface to a peripheral portion of the surface around the central portion | S200 |

↓

| Perform inkjet printing on each sub-pixel region of the display substrate to form a hole injection layer, and then sequentially form a hole transport layer, an organic light emitting layer, and the like by inkjet printing, thereby forming a light emitting functional layer | S300 |

FIG. 6

DISPLAY SUBSTRATE, METHOD OF MANUFACTURING DISPLAY SUBSTRATE, DISPLAY PANEL, AND MASK

CROSS-REFERENCE TO RELATED APPLICATION

This application claims priority to Chinese Patent Application No. 201910848604.4, filed on Sep. 9, 2019, entitled "DISPLAY SUBSTRATE, METHOD OF MANUFACTURING DISPLAY SUBSTRATE, DISPLAY PANEL, AND MASK", which is incorporated herein by reference in its entirety.

TECHNICAL FIELD

Embodiments of the present disclosure relate to the field of display technology, and particularly to a display substrate, a method of manufacturing the display substrate, a display panel, and a mask.

BACKGROUND

At present, each of functional layers of an organic light emitting diode (OLED), such as a hole injection layer, a hole transport layer, and an organic light emitting layer is usually formed in a specific pattern by means of inkjet printing technology.

SUMMARY

In an aspect, embodiments of the present disclosure provide a method of manufacturing a display substrate, including: forming a first electrode layer on a substrate, the first electrode layer including a plurality of first electrodes arranged in an array; performing a surface treatment on the plurality of first electrodes, such that an affinity of a surface of each of the plurality of first electrodes gradually increases from a central portion of the surface to a peripheral portion of the surface around the central portion, or the affinity of the central portion of the surface is less than the affinity of the peripheral portion of the surface; and forming a light emitting functional layer on the surfaces of the plurality of first electrodes subjected to the surface treatment.

According to embodiments of the present disclosure, performing the surface treatment on the plurality of first electrodes includes: shielding the first electrode layer with a mask, the mask including a shielding layer, the shielding layer including a plurality of shielding units arranged in an array in one-to-one correspondence with the plurality of first electrodes, each of the plurality of shielding units having a central part and a peripheral part around the central part, and a shielding capacity of each of the plurality of shielding units gradually decreasing from the central part to the peripheral part, or the shielding capacity of the central part being greater than the shielding capacity of the peripheral part; and performing the surface treatment on the plurality of first electrodes shielded by the mask, such that the affinity of the surface of each of the plurality of first electrodes gradually increases from the central portion of the surface to the peripheral portion of the surface around the central portion, or the affinity of the central portion of the surface is less than the affinity of the peripheral portion of the surface.

According to embodiments of the present disclosure, the mask further including a film layer, wherein the shielding layer is located on a side of the film layer, the shielding layer is formed of a material containing a shielding material, and a content of the shielding material of each of the plurality of shielding units of the shielding layer gradually decreases from the central part to the peripheral part, or the content of the shielding material of the central part is greater than the content of the shielding material of the peripheral part.

According to embodiments of the present disclosure, the mask further includes a film layer, the shielding layer is located on a side of the film layer, the shielding layer is formed of a shielding material or a material containing the shielding material, and a thickness of each of the plurality of shielding units of the shielding layer gradually decreases from the central part to the peripheral part, or the thickness of the central part is greater than the thickness of the peripheral part.

According to embodiments of the present disclosure, the mask further includes a film layer, the shielding layer is located on a side of the film layer, the shielding layer is formed of a shielding material or a material containing the shielding material, and each of the plurality of shielding units of the shielding layer is smaller than a corresponding one of the plurality of first electrodes, and has a same size as the central portion of the surface of the corresponding one of the plurality of first electrodes, such that each of the plurality of shielding units shields the central portion of the surface of a corresponding one of the plurality of first electrodes but exposes the peripheral portion of the surface of the corresponding one of the plurality of first electrodes.

According to embodiments of the present disclosure, the shielding layer is formed of a material containing a shielding material, the plurality of shielding units of the shielding layer are constituted by a plurality of parts of the shielding layer, respectively, and a content of the shielding material of each of the plurality of shielding units of the shielding layer gradually decreases from the central part to the peripheral part, or the content of the shielding material of the central part is greater than the content of the shielding material of the peripheral part.

According to embodiments of the present disclosure, the shielding material includes an ultraviolet ray absorbing material and the surface treatment includes an ultraviolet radiation treatment; or the shielding material includes an oxygen plasma shielding material and the surface treatment includes an oxygen plasma treatment.

According to embodiments of the present disclosure, the first electrode includes an anode, and the light emitting functional layer includes a hole injection layer.

According to embodiments of the present disclosure, a material of the first electrode includes indium tin oxide.

According to embodiments of the present disclosure, on the surfaces of the plurality of first electrodes subjected to the surface treatment, the patterned light emitting functional layer is formed of an ink by inkjet printing.

In another aspect, embodiments of the present disclosure provide a display substrate manufactured by the above method.

In a further aspect, embodiments of the present disclosure provide a display panel including the above display substrate.

In still another aspect, embodiments of the present disclosure provide a mask including: a shielding layer including a plurality of shielding units arranged in an array, wherein each of the plurality of shielding units has a central part and a peripheral part around the central part, and a shielding capacity of each of the plurality of shielding units gradually decreases from the central part to the peripheral part, or the shielding capacity of the central part is greater than the shielding capacity of the peripheral part.

According to embodiments of the present disclosure, the mask is configured for manufacturing a display substrate, in the display substrate, a first electrode layer is formed on a substrate, and the first electrode layer includes a plurality of first electrodes arranged in an array in one-to-one correspondence with the plurality of shielding units; and the mask is configured for performing a surface treatment on each of the plurality of first electrodes, such that an affinity of a surface of each of the plurality of first electrodes gradually increases from a central portion of the surface to a peripheral portion of the surface around the central portion, or the affinity of the central portion of the surface is less than the affinity of the peripheral portion of the surface.

According to embodiments of the present disclosure, the mask further including a film layer, wherein the shielding layer is located on a side of the film layer, the shielding layer is formed of a shielding material or a material containing the shielding material, and a thickness of each of the plurality of shielding units of the shielding layer gradually decreases from the central part to the peripheral part, or the thickness of the central part is greater than the thickness of the peripheral part.

According to embodiments of the present disclosure, the mask further including: a film layer, wherein the shielding layer is located on a side of the film layer, the shielding layer is formed of a shielding material or a material containing the shielding material, and a thickness of each of the plurality of shielding units of the shielding layer gradually decreases from the central part to the peripheral part, or the thickness of the central part is greater than the thickness of the peripheral part.

According to embodiments of the present disclosure, the mask further including a film layer, wherein the shielding layer is located on a side of the film layer, the shielding layer is formed of a shielding material or a material containing the shielding material, and each of the plurality of shielding units of the shielding layer is smaller than a corresponding one of the plurality of first electrodes, and has a same size as the central portion of the surface of the corresponding one of the plurality of first electrodes, such that each of the plurality of shielding units shields the central portion of the surface of a corresponding one of the plurality of first electrodes but exposes the peripheral portion of the surface of the corresponding one of the plurality of first electrodes.

According to embodiments of the present disclosure, the shielding layer is formed of a material containing a shielding material, the plurality of shielding units of the shielding layer are constituted by a plurality of parts of the shielding layer, respectively, and a content of the shielding material of each of the plurality of shielding units of the shielding layer gradually decreases from the central part to the peripheral part, or the content of the shielding material of the central part is greater than the content of the shielding material of the peripheral part.

According to embodiments of the present disclosure, the shielding material includes an ultraviolet ray absorbing material, or an oxygen plasma shielding material.

According to embodiments of the present disclosure, a material of the film layer includes ethylene-vinyl acetate copolymer.

Other features and advantages of embodiments of the present disclosure will be set forth in the description which follows and, in part, will be obvious from the description, or may be learned by practice of the embodiments of the present disclosure. The other advantages of the embodiments of the present disclosure can be achieved and obtained by solutions described in the description, the claims, and the drawings.

BRIEF DESCRIPTION OF THE DRAWINGS

The drawings described herein are used to provide understanding of technical solutions of the embodiments of the present disclosure and constitute a part of the description. The technical solutions of the present disclosure are explained by means of the drawings together with the following embodiments of the present disclosure but should not be construed as being limited to the drawings. Shapes and sizes of these components/elements shown in the drawings do not reflect real proportion, but are intended only to illustrate the contents of this disclosure.

FIG. 5 is a schematic diagram of a setting of a shielding material of a single shielding unit of a mask according to an embodiment of the present disclosure;

FIG. 6 is a schematic flow diagram of a method of manufacturing a display substrate according to an embodiment of the present disclosure;

DETAILED DESCRIPTION

Figure 1:
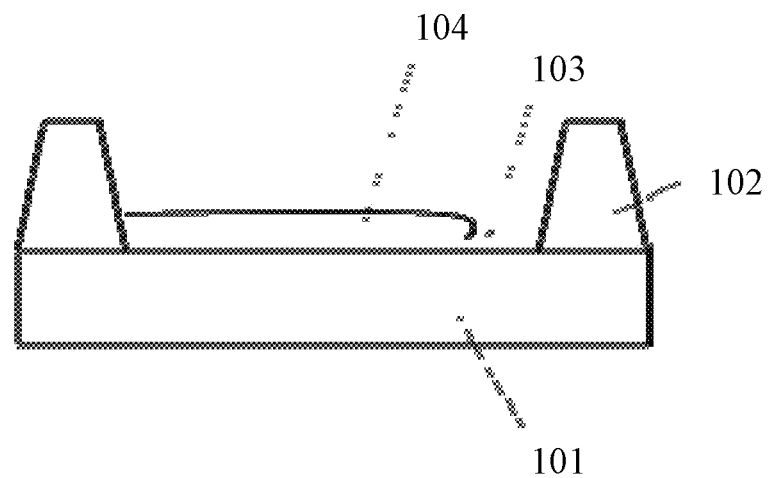
FIG. 1 is a schematic view showing a manufacturing process of a single sub-pixel region of a display substrate in related art.

Various embodiments are described in the present disclosure, but the description is exemplary rather than limitary, and it will be apparent to those of ordinary skill in the art that within the scope of the embodiments described in the present disclosure, there may be more embodiments and implementations. Although many possible combinations of features are shown in the drawings and discussed in the detailed description, many other combinations of the disclosed features are also possible. Unless specifically limited, any feature or element of any embodiment may be used in combination with or may substitute for any other feature or element of any other embodiment.

The present disclosure includes and contemplates combinations with features and elements known to those of ordinary skill in the art. The embodiments, features, and elements that have been disclosed in the present disclosure may also be combined with any conventional features or elements to form particular inventive solutions as defined by the claims. Any feature or element of any embodiment may also be combined with features or elements from any other inventive solution to form another particular inventive solution as defined by the claims. Therefore, it should be understood that any features shown and/or discussed in the present disclosure may be implemented individually or in any suitable combination. Accordingly, the embodiments are not limited except by the appended claims and their equivalents. In addition, various modifications and changes may be made within the scope of the appended claims.

Further, in describing representative embodiments, the disclosure may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps disclosed herein should not be construed as limitations on the claims. In addition, any future claims directed to a method and/or process should not be limited to the performance of their steps in the order written and, as such, one of ordinary skill in the art would readily appreciate that the sequences may be varied and still remain within the spirit and scope of the present disclosure.

FIG. 1 is a schematic view showing a manufacturing process of a single sub-pixel region of a display substrate in related art. As shown in FIG. 1, an ITO anode 103 is formed on a substrate 101 by a sputtering process, and a pixel defining layer 102 is formed on the substrate 101. A hole injection layer may be formed on a surface of the ITO anode 103 by inkjet printing. However, generally, the surface of the ITO anode 103 has a substantially uniform affinity for an ink. Therefore, in the inkjet printing process, if a volume of the ink is low, it is easy to cause the dewetting of the hole injection layer. As shown in FIG. 1, there is the dewetting of the hole injection layer 104 formed by inkjet printing. In the case shown in FIG. 1, in subsequent inkjet printing processes of functional layers such as a hole transport layer and an organic light emitting layer on the hole injection layer 104, the dewetting of the film layers will further continue, resulting in the nonuniformity of the formed film layers and degrading luminous uniformity.

The embodiments of the present disclosure provide a display substrate, a method of manufacturing the display substrate, a display panel, and a mask. A surface treatment (such as an ultraviolet radiation treatment, or an oxygen plasma treatment) is performed on first electrodes in sub-pixel regions of the display substrate, such that an affinity of a surface of the first electrode in each of the sub-pixel regions gradually increases from a central portion of the surface to a peripheral portion of the surface around the central portion. In this way, in the inkjet printing process on the surfaces of the first electrodes, the dewetting in the sub-pixel regions can be avoided, thereby improving the uniformity of the overall film layers of the display substrate, improving the luminous uniformity of the display substrate, and improving the yield of the display substrate.

The technical solutions of the embodiments of the present disclosure are described in detail below through specific embodiments. The "patterning process" mentioned in the embodiments of the present disclosure includes processes such as depositing a film layer, coating a photoresist, exposing with a mask, developing, etching, and stripping the photoresist, and is a mature manufacturing process in the related art. The depositing may be known processes such as sputtering, vapor deposition, or chemical vapor deposition, the coating may be a known coating process, and the etching may be a known method, which are not specifically limited herein.

Figure 2:
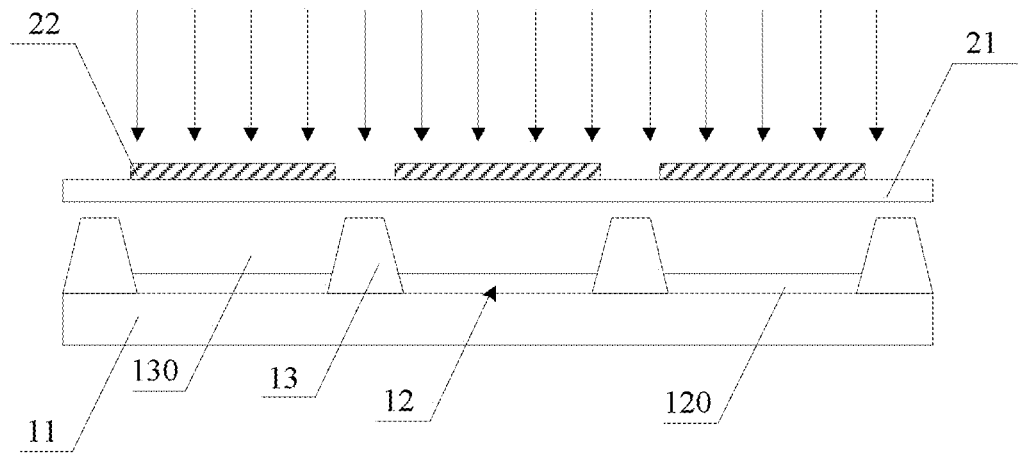
FIG. 2 is a schematic view showing a manufacturing process of a display substrate according to an embodiment of the present disclosure.

Embodiments of the present disclosure provide a method of manufacturing a display substrate. Referring to FIG. 2, the method includes: forming a first electrode layer 12 on a substrate 11, the first electrode layer 12 including a plurality of first electrodes 120 arranged in an array; performing a surface treatment on the plurality of first electrodes 120, such that an affinity of a surface of each of the plurality of first electrodes 120 gradually increases from a central portion of the surface to a peripheral portion of the surface around the central portion, or the affinity of the central portion of the surface is less than the affinity of the peripheral portion of the surface; and forming a light emitting functional layer on the surfaces of the plurality of first electrodes 120 subjected to the surface treatment.

Referring to FIGS. 2-4, 8 and 9, in embodiments of the present disclosure, performing the surface treatment on the plurality of first electrodes 120 includes: shielding the first electrode layer 12 with a mask, the mask including a shielding layer 22, the shielding layer 22 including a plurality of shielding units 220 arranged in an array in one-to-one correspondence with the plurality of first electrodes 120, each of the plurality of shielding units 220 having a central part and a peripheral part around the central part, and a shielding capacity of each of the plurality of shielding units 220 gradually decreasing from the central part to the peripheral part, or the shielding capacity of the central part being greater than the shielding capacity of the peripheral part; and performing the surface treatment on the plurality of first electrodes 120 shielded by the mask, such that the affinity of the surface of each of the plurality of first electrodes 120 gradually increases from the central portion of the surface to the peripheral portion of the surface around the central portion, or the affinity of the central portion of the surface is less than the affinity of the peripheral portion of the surface.

Figure 3:
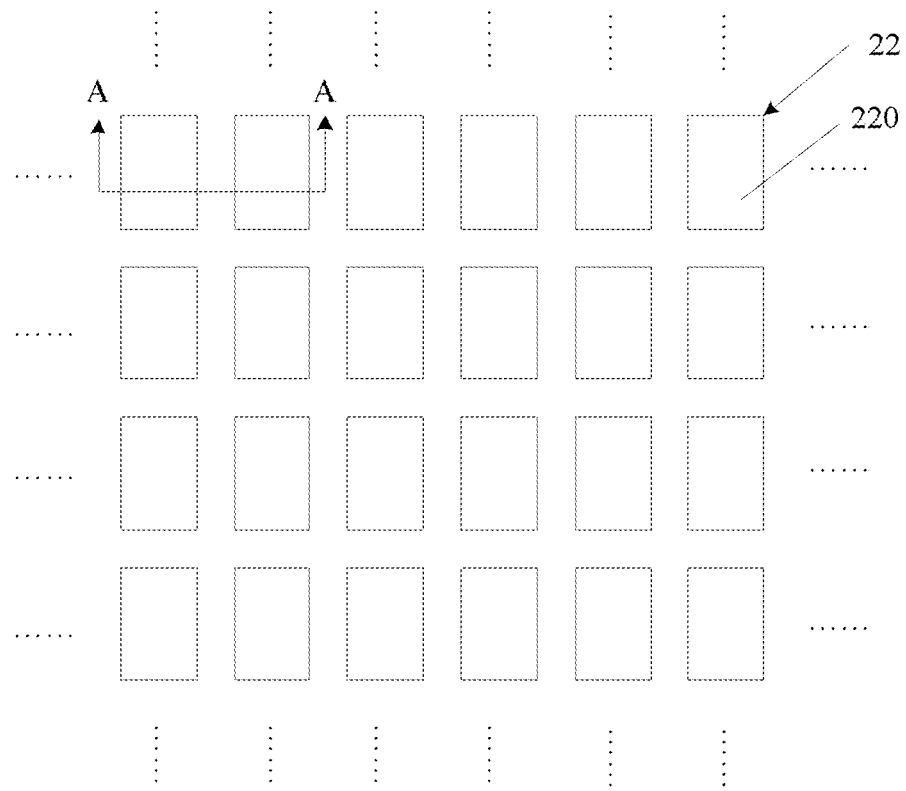
FIG. 3 is a schematic top view of a mask according to an embodiment of the present disclosure.
Figure 4:
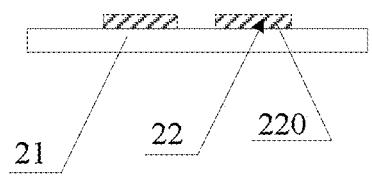
FIG. 4 is a schematic partial sectional view of the mask taken along the line AA in FIG. 3.

Referring to FIGS. 2 to 4, in embodiments of the present disclosure, the mask further includes a film layer 21, the shielding layer 22 is located on a side of the film layer 21, the shielding layer 22 is formed of a material containing a shielding material, and a content of the shielding material of each of the plurality of shielding units 220 of the shielding layer 22 gradually decreases from the central part to the peripheral part, or the content of the shielding material of the central part is greater than the content of the shielding material of the peripheral part.

Referring to FIGS. 2 to 4, in embodiments of the present disclosure, the mask further includes a film layer 21, the shielding layer 22 is located on a side of the film layer 21, the shielding layer 22 is formed of a shielding material or a material containing the shielding material, and a thickness of each of the plurality of shielding units 220 of the shielding layer 22 gradually decreases from the central part to the peripheral part, or the thickness of the central part is greater than the thickness of the peripheral part.

Referring to FIGS. 2 to 4, in embodiments of the present disclosure, the mask further includes a film layer 21, the shielding layer 22 is located on a side of the film layer 21, the shielding layer 22 is formed of a shielding material or a material containing the shielding material, and each of the plurality of shielding units 220 of the shielding layer 22 is smaller than a corresponding one of the plurality of first electrodes 120, and has a same size as the central portion of the surface of the corresponding one of the plurality of first electrodes 120, such that each of the plurality of shielding units 220 shields the central portion of the surface of a corresponding one of the plurality of first electrodes 120 but exposes the peripheral portion of the surface of the corresponding one of the plurality of first electrodes 120. In this case, the shielding unit 220 may have a uniform thickness.

Figure 8:
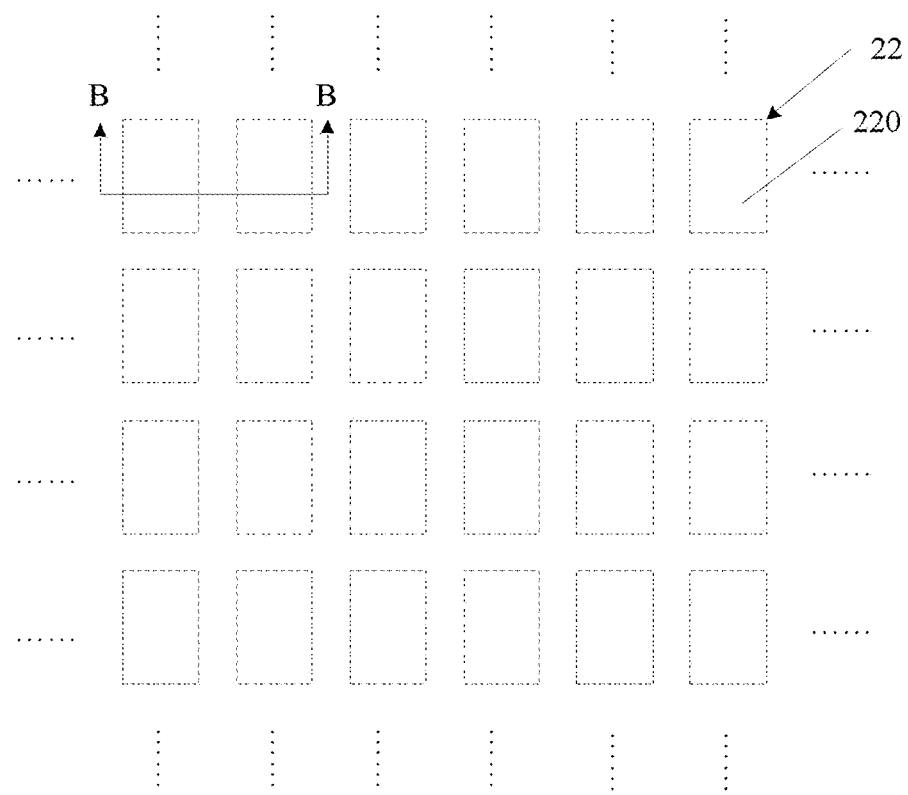
FIG. 8 is a schematic top view of a mask according to another embodiment of the present disclosure.
Figure 9:
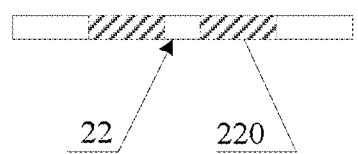
FIG. 9 is a schematic partial sectional view of the mask taken along the line BB in FIG. 8.

Referring to FIGS. 8 and 9, in embodiments of the present disclosure, the shielding layer 22 is formed of a material containing a shielding material, the plurality of shielding units 220 of the shielding layer 22 are constituted by a plurality of parts (as indicated by dashed lines in FIGS. 8 and 9) of the shielding layer 22, respectively, and a content of the shielding material of each of the plurality of shielding units 220 of the shielding layer 22 gradually decreases from the central part to the peripheral part, or the content of the shielding material of the central part is greater than the content of the shielding material of the peripheral part.

In the embodiments of the present disclosure, the affinity of the surface of each of the plurality of first electrodes 120 gradually increases from the central portion of the surface to the peripheral portion of the surface around the central portion, or the affinity of the central portion of the surface is less than the affinity of the peripheral portion of the surface. In this way, in the inkjet printing process on the surfaces of the first electrodes, the dewetting in the sub-pixel regions can be avoided, thereby improving the uniformity of the overall film layers of the display substrate, improving the luminous uniformity of the display substrate, and improving the yield of the display substrate. Further, if the dewetting in the sub-pixel region occurs in the peripheral portion of the surface of the first electrode 120 around the central portion, the affinity of the central portion of the surface of the first electrode 120 is less than the affinity of the peripheral portion of the surface of the first electrode 120 around the central portion, thereby simplifying a manufacturing process of the mask. A size of the peripheral portion may be determined according to an area where the dewetting in the sub-pixel region occurs.

Embodiments of the present disclosure further provide a method of manufacturing a display substrate. As shown in FIG. 6, the method includes the following steps.

In a step S100, a first electrode layer and a pixel defining layer are sequentially formed on a substrate. The first electrode layer includes a plurality of first electrodes arranged in an array, and the pixel defining layer is formed with a plurality of openings arranged in an array. Each of the plurality of openings exposes one of the first electrodes.

In the present embodiment, the first electrode layer is an anode layer, and the first electrode is an anode. A material of the first electrode may be indium tin oxide (ITO). However, the present disclosure is not limited to this.

Sequentially forming the first electrode layer and the pixel defining layer on the substrate may include: depositing a conductive film on the substrate 11, and patterning the conductive film by a patterning process to form a pattern of the first electrode layer 12 on the substrate 11; and depositing a pixel defining film on the substrate 11 formed with the above pattern, exposing the pixel defining film with the mask, and developing the exposed pixel defining film to form a pattern of the pixel defining layer 13, as shown in FIG. 2. The pixel defining layer 13 may be formed with a plurality of openings 130 arranged in an array. Each of the plurality of openings 130 exposes one of the first electrodes, i.e. one anode corresponding to one sub-pixel. A surface of the first electrode and the opening 130 of the pixel defining layer 13 exposing the first electrode may form a groove. The groove can receive an ink drop in which a material for a light emitting functional layer is dissolved, so that one sub-pixel structure is formed in each groove.

As shown in FIG. 2, a cross-sectional shape of each opening 130 may be an inverted trapezoid, so that when ink is sprayed during inkjet printing, the ink is in full contact with the pixel defining layer 13 with the opening 130 and the surface of the first electrode.

The conductive film may be formed of a metal material such as Ag, Cu, Al, or Mo, or an alloy of one or more of the above metals such as AlNd or MoNb; may be a plurality of metal layers such as a Mo layer, a Cu layer and a Mo layer stacked in sequence; or may be a stacked structure formed of metal and transparent conductive materials such as a stacked structure formed of an ITO layer, an Ag layer and an ITO layer stacked in sequence. The pixel defining film may be formed of fluorine-containing polyimide. However, the present disclosure is not limited to this.

In a step S200, an ultraviolet radiation treatment is performed on the first electrodes while the first electrode layer is shielded with a mask, such that an affinity of a surface of each of the first electrodes gradually increases from a central portion of the surface to a peripheral portion of the surface around the central portion.

In the embodiment, the ultraviolet radiation treatment may be performed on the entire display substrate while the first electrode layer is shielded with the mask on a side of the first electrode layer facing away from the substrate. Uniform ultraviolet rays are used to radiate the entire display substrate. Because of an ultraviolet ray absorbing effect of the mask, the affinity of the surface of the first electrode of each sub-pixel of the display substrate gradually increases from the central portion of the surface to the peripheral portion of the surface around the central portion.

FIG. 3 is a schematic top view of a mask according to an embodiment of the present disclosure. FIG. 4 is a schematic partial sectional view of the mask taken along the line AA in FIG. 3. As shown in FIG. 4, the mask according to the present embodiment includes: a film layer 21; and a shielding layer 22 formed on the film layer 21. A material of the film layer 21 may be ethylene-vinyl acetate copolymer (EVA), i.e. a thermoplastic resin, with an excellent weathering resistance. However, the present disclosure is not limited to this.

As shown in FIG. 3, the shielding layer 22 may have a plurality of shielding units. The plurality of shielding units are arranged in one-to-one correspondence with the plurality of first electrodes and are formed of a material containing a shielding material. Each of the plurality of shielding units has a central part and a peripheral part around the central part. A content of the shielding material of each of the plurality of shielding units gradually decreases from the central part to the peripheral part. In the present embodiment, the shielding material is an ultraviolet ray absorbing material. The ultraviolet ray absorbing material may include at least one of ortho-hydroxybenzophenone, ortho-hydroxybenzotriazole, ortho-hydroxy salicylic acid phenyl ester, and ortho-hydroxytriazine. However, the present disclosure is not limited to this.

For example, the shielding material is magnetically modified by introducing a magnetic group or moiety into the shielding material, so that the shielding material is dragged to be movable in an electric field. The shielding material is mixed with a base material, and the content of the shielding material is a predetermined mass percentage. A mixture of the shielding material and the base material is coated on the film layer 21 or a glass substrate. Electric fields corresponding in position to the sub-pixels are applied under the film layer 21 or the glass substrate. Under the action of the electric fields, the shielding material is moved but the base material is not moved, so that the shielding units are formed of the mixture on a surface of the film layer 21 or the glass substrate. Thereby, a mass percentage of the shielding material of the shielding unit gradually decreases from the central part of the shielding unit to the peripheral part of the shielding unit around the central part. For example, the predetermined mass percentage of the shielding material is 5%, the mass percentage of the shielding material is 8% in the central part of the shielding unit, and the mass percentage of the shielding material is 2% in the peripheral part of the shielding unit. The shielding material may be an ultraviolet ray absorbing material, or an oxygen plasma shielding material. For example, the ultraviolet ray absorbing material is at least one of ortho-hydroxybenzophenone, ortho-hydroxybenzotriazole, ortho-hydroxysalicylic acid phenyl ester, and ortho-hydroxytriazine, and the base material may be ethylene-vinyl acetate copolymer (EVA). If the mask does not include the film layer 21, the glass substrate may be used.

As shown in FIGS. 2 and 3, the shielding units of the shielding layer 22 are arranged in one-to-one correspondence with the openings 130 of the pixel defining layer 13 formed on the substrate 11, and each shielding unit may cover a corresponding one of the openings 130 to shield the first electrode exposed by the opening 130. In other words, arrangement positions, a shape, and a size of the shielding units of the mask can be determined according to arrangement positions, a shape, and a size of the sub-pixels of the display substrate. For example, each shielding unit may have a shape of a rectangle or a rounded rectangle, and the size of each shield unit may be the same as or slightly larger than the size of the sub-pixel. However, the present disclosure is not limited to this.

FIG. 5 is a schematic diagram of a setting of the shielding material (which is the ultraviolet ray absorbing material in the present embodiment) of the single shielding unit of the mask according to the present embodiment. As shown in FIG. 5, each shielding unit includes a central part and a plurality of strip parts having a ring shape (for example a rectangular-ring shape) and surrounding the central part, outer peripheries of the central part and strip parts are concentric and proportional or geometrically similar. The central part and the plurality of strip parts constitute sub-regions. The sub-regions are separated by dashed lines in FIG. 5. The content of the ultraviolet ray absorbing material in each of the sub-regions is substantially uniform, and the content of the ultraviolet ray absorbing material in any one of the sub-regions is inversely proportional to a distance from the one sub-region to the center of the shielding unit. In other words, the nearer any one of the sub-regions is to the center, the greater the content of the ultraviolet ray absorbing material in the one sub-region. As shown in FIG. 5, The content of the ultraviolet ray absorbing material in the sub-region S1 in the center is the greatest, and then the sub-region S2, the sub-region S3, the sub-region S4, the sub-region S5, and the sub-region S6 successively decreases in the content of the ultraviolet ray absorbing material. However, the present disclosure is not limited to this.

As shown in FIG. 2, when the mask shields the display substrate, the shielding layer 22 of the mask is located on the side of the film layer 21 facing away from the substrate 11. Furthermore, the shielding units of the mask can be located in one-to-one correspondence with the first electrodes exposed by the openings 130 of the pixel defining layer 13, and each shielding unit can shield the first electrode of one sub-pixel.

As shown in FIG. 2, in the present embodiment, the mask may be arranged over the substrate 11 formed with the first electrode layer 12 and the pixel defining layer 13, so that each shielding unit shields the first electrode of one sub-pixel correspondingly. Then, an ultraviolet radiation treatment is performed from the side of the shielding layer 22 away from the film layer 21. Uniform ultraviolet rays are used to radiate the entire display substrate, so that the ultraviolet rays irradiate the first electrode layer 12 through the shielding units of the mask. Since the content of the ultraviolet ray absorbing material of each of the shielding units successively decreases from the central part of the shielding unit to the peripheral part of the shielding unit around the central part, an intensity of the ultraviolet rays transmitted by each of the shielding units successively increases from the central part of the shielding unit to the peripheral part of the shielding unit. In this way, the ultraviolet radiation treatment is performed on the first electrode in each sub-pixel region of the display substrate in such a way that the intensity of the ultraviolet rays gradually increases from the central part to the peripheral part.

For example, in the case where the material of the first electrode (anode) is ITO, in the process of performing the ultraviolet radiation treatment on a surface of the anode layer, interstitial oxygen will diffuse into the ITO anode layer to form an inactive complex with tin (Sn), thereby reducing the number of electrons in a conduction band and increasing the work function of ITO. The greater the intensity of the ultraviolet irradiation, the smaller the contact angle of the surface of the ITO anode layer and the larger the surface energy of the ITO anode layer. The smaller the contact angle, the easier it is for the solution (or droplets) to fully spread on the surface of the ITO anode layer. In this way, in each sub-pixel region, the spreadability of the solution on the surface of the ITO anode layer increases from the central portion of the surface to the peripheral portion of the surface, thereby reducing the probability of occurrence of the dewetting in the sub-pixel region.

In a step S300, after the ultraviolet irradiation treatment is completed, the mask is removed, and inkjet printing is performed on each sub-pixel region of the display substrate to form a hole injection layer, and then a hole transport layer, an organic light emitting layer, and the like are sequentially formed by inkjet printing, thereby forming a light emitting functional layer.

In this step, after the mask is removed, different solutions may be sequentially dropped into the groove corresponding to each sub-pixel by the inkjet printing technology to form the hole injection layer, the hole transport layer, and the organic light emitting layer in sequence in the groove, and then an electron transport layer and an electron injection layer may be formed by a vapor deposition process.

Subsequent manufacturing processes include processes for forming structures such as a cathode as a second electrode, and an encapsulation layer, and the manufacturing method is the same as that of the related art and is no longer described for the sake of brevity.

In the present embodiment, the ultraviolet radiation treatment is performed on the first electrodes in the sub-pixel regions, such that the affinity of the surface of the first electrode in each of the sub-pixel regions gradually increases from the central portion of the surface to the peripheral portion of the surface around the central portion. In other words, an edge of the surface in the sub-pixel region has the increased affinity for the ink. In this way, the dewetting in the sub-pixel regions can be avoided, thereby improving the uniformity of the overall film layers, improving the luminous uniformity, and improving the yield of the display substrate.

Figure 7:
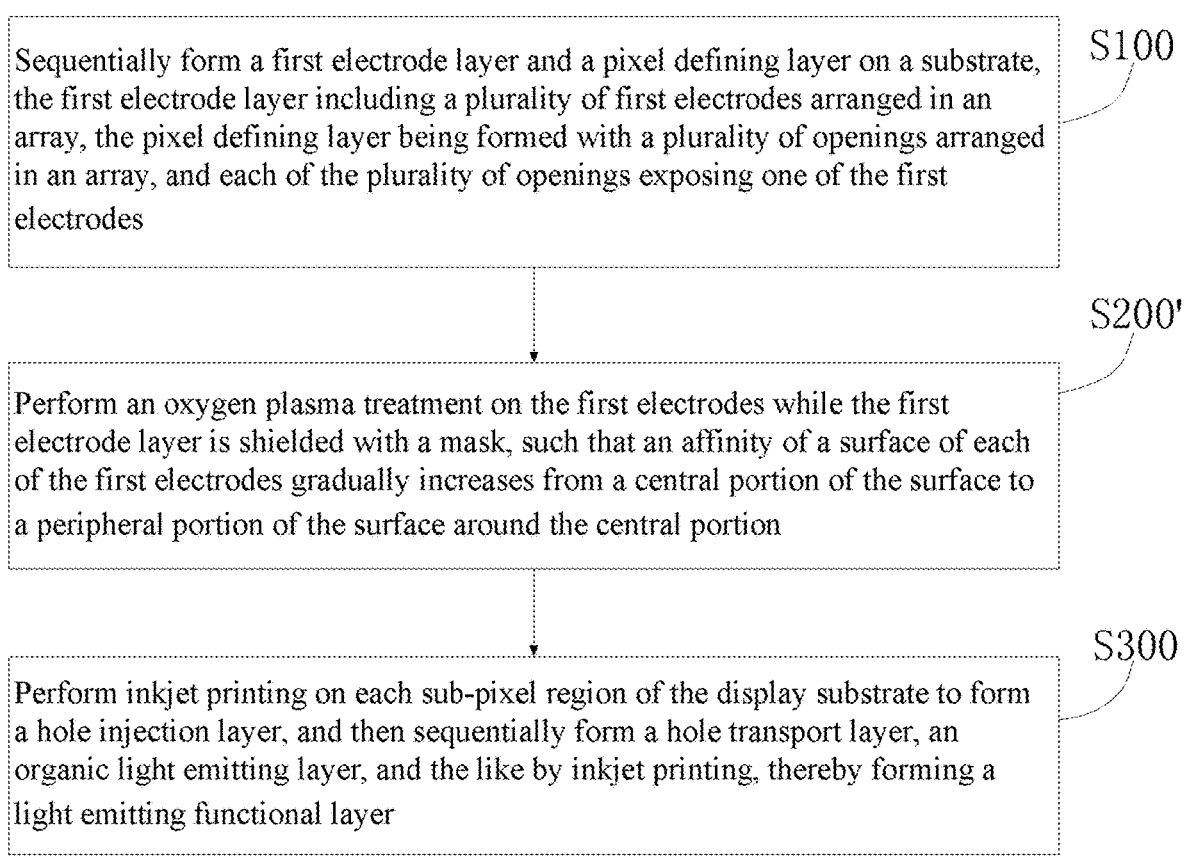
FIG. 7 is a schematic flow diagram of a method of manufacturing a display substrate according to another embodiment of the present disclosure.

Embodiments of the present disclosure further provide a method of manufacturing a display substrate. As shown in FIG. 7. The method in the embodiment shown in FIG. 7 is different from the method in the embodiment shown in FIG. 6 in that in a step S200', an oxygen plasma treatment is performed on the first electrodes. The mask used in the embodiment shown in FIG. 7 is different from the mask used in the embodiment shown in FIG. 6 in that the shielding material is an oxygen plasma shielding material.

In the present embodiment, in the step S200', the mask may be arranged over the substrate 11 formed with the first electrode layer 12 and the pixel defining layer 13, so that each shielding unit shields a corresponding one of the first electrodes exposed by the openings of the pixel defining layer. After that, the mask and the substrate are put into an oxygen plasma generator together, and the oxygen plasma treatment is performed on the substrate at a voltage and at a current for a period of time. Since the content of the oxygen plasma shielding material of each of the shielding units successively decreases from the central part of the shielding unit to the peripheral part of the shielding unit around the central part, the affinity of the surface of the first electrode in each of the sub-pixel regions gradually increases from the central portion of the surface to the peripheral portion of the surface around the central portion.

In an example, in the case where the material of the first electrode (anode) is ITO, in the oxygen plasma generator, a large-volume oxygen plasma may be generated in a vacuum chamber by radio frequency or microwave discharge excitation. The display substrate shielded with the mask is placed on a metal substrate table immersed in the oxygen plasma, with the mask facing towards the oxygen plasma. The metal substrate table is insulated from the wall of the vacuum chamber and the ground, and is connected to a high-voltage negative pulse square wave power source so that a high-voltage negative pulse is applied to the substrate table. Thereby, a plasma sheath is formed between the substrate and the oxygen plasma. Oxygen ions are accelerated to move towards the surface of the ITO anode layer by an electric field in the sheath. The high-energy oxygen ions are implanted into the surface of the ITO anode layer and are retained in a surface layer of the anode layer. Therefore, the ratio of the number of oxygen atoms to the number of Sn and In atoms in the surface of the ITO anode layer is increased. The surface work function is directly proportional to the ratio, thereby increasing the surface work function. The greater the concentration of the oxygen plasma, the smaller the contact angle of the surface of the ITO anode layer and the larger the surface energy of the ITO anode layer. The smaller the contact angle, the easier it is for the solution (or droplets) to fully spread on the surface of the ITO anode layer. In this way, in each sub-pixel region, the spreadability of the solution on the surface of the ITO anode layer increases from the central portion of the surface to the peripheral portion of the surface, thereby reducing the probability of occurrence of the dewetting in the sub-pixel region.

The present embodiment can also achieve the effects of the above embodiment. The dewetting in the sub-pixel regions can be avoided, thereby improving the uniformity of the overall film layers, improving the luminous uniformity, and improving the yield of the display substrate.

Embodiments of the present disclosure provide an array substrate manufactured by the method according to any one of the above embodiments. The display substrate may be an OLED display substrate.

Embodiments of the present disclosure provide a display panel including the display substrate according to the above embodiments. The display panel according to the present embodiments may be an OLED display panel. The uniformity of the overall film layers of the display substrate according to the above embodiment is improved. Thereby, the luminous uniformity and the display effect of the display panel according to the present embodiment can be improved.

The display panel according to the present embodiment may be applied to any products or parts having a display function such as a mobile phone, a tablet computer, a television, a display, a notebook computer, a digital frame, and a navigator.

Embodiments of the present disclosure further provide a mask. Referring to FIGS. 2-4, 8 and 9, the mask includes: a shielding layer 22. The shielding layer 22 includes a plurality of shielding units 220 arranged in an array. Each of the plurality of shielding units 220 has a central part and a peripheral part around the central part, and a shielding capacity of each of the plurality of shielding units 220 gradually decreases from the central part to the peripheral part, or the shielding capacity of the central part is greater than the shielding capacity of the peripheral part.

Referring to FIGS. 2-4, 8 and 9, in embodiments of the present disclosure, the mask is configured for manufacturing a display substrate. In the display substrate, a first electrode layer 12 is formed on a substrate 11, and the first electrode layer 12 includes a plurality of first electrodes 220 arranged in an array in one-to-one correspondence with the plurality of shielding units 220. Further, the mask is configured for performing a surface treatment on each of the plurality of first electrodes 120, such that an affinity of a surface of each of the plurality of first electrodes 120 gradually increases from a central portion of the surface to a peripheral portion of the surface around the central portion, or the affinity of the central portion of the surface is less than the affinity of the peripheral portion of the surface.

Referring to FIGS. 2 to 4, in embodiments of the present disclosure, the mask further includes: a film layer 21. The shielding layer 22 is located on a side of the film layer 21. The shielding layer 22 is formed of a material containing a shielding material, and a content of the shielding material of each of the plurality of shielding units 220 of the shielding layer 22 gradually decreases from the central part to the peripheral part, or the content of the shielding material of the central part is greater than the content of the shielding material of the peripheral part.

Referring to FIGS. 2 to 4, in embodiments of the present disclosure, the mask further includes: a film layer 21. The shielding layer 22 is located on a side of the film layer 21. The shielding layer 22 is formed of a shielding material or a material containing the shielding material, and a thickness of each of the plurality of shielding units 220 of the shielding layer 22 gradually decreases from the central part to the peripheral part, or the thickness of the central part is greater than the thickness of the peripheral part.

Referring to FIGS. 2 to 4, in embodiments of the present disclosure, the mask further includes: a film layer 21. The shielding layer 22 is located on a side of the film layer 21. The shielding layer 22 is formed of a shielding material or a material containing the shielding material, and each of the plurality of shielding units 220 of the shielding layer 22 is smaller than a corresponding one of the plurality of first electrodes 120, and has a same size as the central portion of the surface of the corresponding one of the plurality of first electrodes 120, such that each of the plurality of shielding units 220 shields the central portion of the surface of a corresponding one of the plurality of first electrodes 120 but exposes the peripheral portion of the surface of the corresponding one of the plurality of first electrodes 120.

Referring to FIGS. 8 and 9, in embodiments of the present disclosure, the shielding layer 22 is formed of a material containing a shielding material, the plurality of shielding units 220 of the shielding layer 22 are constituted by a plurality of parts (as indicated by dashed lines in FIGS. 8 and 9) of the shielding layer 22, respectively, and a content of the shielding material of each of the plurality of shielding units 220 of the shielding layer 22 gradually decreases from the central part to the peripheral part, or the content of the shielding material of the central part is greater than the content of the shielding material of the peripheral part.

Embodiments of the present disclosure further provide a mask configured for manufacturing a display substrate. In the display substrate, a first electrode layer is formed on a substrate, and the first electrode layer includes a plurality of first electrodes arranged in an array. The mask according to the present embodiment includes: a film layer, and a shielding layer formed on the film layer. The shielding layer includes a plurality of shielding units. The plurality of shielding units are arranged in one-to-one correspondence with the plurality of first electrodes and are formed of a material containing a shielding material. The mask is configured for performing a surface treatment on each of the plurality of first electrodes, such that an affinity of a surface of each of the plurality of first electrodes gradually increases from a central portion of the surface to a peripheral portion of the surface around the central portion. When the display substrate is manufactured, the mask shields the display substrate with the shielding layer located on a side of the film layer facing away from the substrate, and each shielding unit shields the first electrode of one sub-pixel. Thereby, after performing a surface treatment on the display substrate shielded by the mask, an affinity of a surface of the first electrode of each sub-pixel gradually increases from a central portion of the surface to a peripheral portion of the surface around the central portion.

In an exemplary embodiment, a content of the shielding material of each of the plurality of shielding units gradually decreases from the central part to the peripheral part around the central part.

In an exemplary embodiment, the shielding material may include an ultraviolet ray absorbing material, or an oxygen plasma shielding material. When the shielding material includes an ultraviolet ray absorbing material, the surface treatment may be an ultraviolet radiation treatment. When the shielding material includes an oxygen plasma shielding material, the surface treatment may be an oxygen plasma treatment.

In an exemplary embodiment, a material of the film layer may be ethylene-vinyl acetate copolymer.

The detailed description of the mask has been made in the above embodiments and thus is no longer described for the sake of brevity.

In the description of the present disclosure, it is to be noted that orientations or positional relationships indicated by terms such as "upper", "lower", "a side", and "another side" are based on orientations or positional relationships shown in the accompanying drawings, are merely used to facilitate the description of the present disclosure and simplification of the description, but do not indicate or imply that a structure of which an orientation or positional relationship is indicated must have the particular orientation and must be configured and operated in the particular orientation. Therefore, the orientations or positional relationships should not be construed to limit the present disclosure.

Although the above embodiments are disclosed in the present disclosure, the described contents are only embodiments for facilitating understanding the present disclosure, and are not intended to limit the present disclosure. Those skilled in the art may make any changes and modifications to the embodiments in form and detail without departing from the spirit and principles of the present disclosure. However, the protection scope of the present disclosure should be defined by the scope of the appended claims.

What is claimed is:

1. A method of manufacturing a display substrate, comprising:
    forming a first electrode layer on a substrate, the first electrode layer comprising a plurality of first electrodes arranged in an array;
    performing a surface treatment on the plurality of first electrodes, such that an affinity of a surface of each of the plurality of first electrodes gradually increases from a central portion of the surface to a peripheral portion of the surface around the central portion, or the affinity of the central portion of the surface is less than the affinity of the peripheral portion of the surface; and
    forming a light emitting functional layer on the surfaces of the plurality of first electrodes subjected to the surface treatment.

2. The method of claim 1, wherein:
    performing the surface treatment on the plurality of first electrodes comprises:
    shielding the first electrode layer with a mask, the mask comprising a shielding layer, the shielding layer comprising a plurality of shielding units arranged in an array in one-to-one correspondence with the plurality of first electrodes, each of the plurality of shielding units having a central part and a peripheral part around the central part, and a shielding capacity of each of the plurality of shielding units gradually decreasing from the central part to the peripheral part, or the shielding capacity of the central part being greater than the shielding capacity of the peripheral part; and
    performing the surface treatment on the plurality of first electrodes shielded by the mask, such that the affinity of the surface of each of the plurality of first electrodes gradually increases from the central portion of the surface to the peripheral portion of the surface around the central portion, or the affinity of the central portion of the surface is less than the affinity of the peripheral portion of the surface.

3. The method of claim 2, wherein:
    the mask further comprises a film layer, the shielding layer is located on a side of the film layer, the shielding layer is formed of a material containing a shielding material, and a content of the shielding material of each of the plurality of shielding units of the shielding layer gradually decreases from the central part to the peripheral part, or the content of the shielding material of the central part is greater than the content of the shielding material of the peripheral part.

4. The method of claim 2, wherein:
    the mask further comprises a film layer, the shielding layer is located on a side of the film layer, the shielding layer is formed of a shielding material or a material containing the shielding material, and a thickness of each of the plurality of shielding units of the shielding layer gradually decreases from the central part to the peripheral part, or the thickness of the central part is greater than the thickness of the peripheral part.

5. The method of claim 2, wherein:
    the mask further comprises a film layer, the shielding layer is located on a side of the film layer, the shielding layer is formed of a shielding material or a material containing the shielding material, and each of the plurality of shielding units of the shielding layer is smaller than a corresponding one of the plurality of first electrodes, and has a same size as the central portion of the surface of the corresponding one of the plurality of first electrodes, such that each of the plurality of shielding units shields the central portion of the surface of a corresponding one of the plurality of first electrodes but exposes the peripheral portion of the surface of the corresponding one of the plurality of first electrodes.

6. The method of claim 2, wherein:
the shielding layer is formed of a material containing a shielding material, the plurality of shielding units of the shielding layer are constituted by a plurality of parts of the shielding layer, respectively, and a content of the shielding material of each of the plurality of shielding units of the shielding layer gradually decreases from the central part to the peripheral part, or the content of the shielding material of the central part is greater than the content of the shielding material of the peripheral part.

7. The method of claim 3, wherein:
the shielding material comprises an ultraviolet ray absorbing material and the surface treatment comprises an ultraviolet radiation treatment; or the shielding material comprises an oxygen plasma shielding material and the surface treatment comprises an oxygen plasma treatment.

8. The method of claim 1, wherein:
the first electrode comprises an anode, and the light emitting functional layer comprises a hole injection layer.

9. The method of claim 1, wherein:
a material of the first electrode comprises indium tin oxide.

10. The method of claim 1, wherein:
on the surfaces of the plurality of first electrodes subjected to the surface treatment, the patterned light emitting functional layer is formed of an ink by inkjet printing.

11. A display substrate manufactured by the method of claim 1.

12. A display panel comprising the display substrate of claim 11.

13. A mask comprising:
a shielding layer comprising a plurality of shielding units arranged in an array,
wherein each of the plurality of shielding units has a central part and a peripheral part around the central part, and a shielding capacity of each of the plurality of shielding units gradually decreases from the central part to the peripheral part, or the shielding capacity of the central part is greater than the shielding capacity of the peripheral part,
and wherein the mask is configured for manufacturing a display substrate, in the display substrate, a first electrode layer is formed on a substrate, and the first electrode layer comprises a plurality of first electrodes arranged in an array in one-to-one correspondence with the plurality of shielding units; and
the mask is configured for performing a surface treatment on each of the plurality of first electrodes, such that an affinity of a surface of each of the plurality of first electrodes gradually increases from a central portion of the surface to a peripheral portion of the surface around the central portion, or the affinity of the central portion of the surface is less than the affinity of the peripheral portion of the surface.

14. The mask of claim 13, further comprising:
a film layer, wherein the shielding layer is located on a side of the film layer, the shielding layer is formed of a material containing a shielding material, and a content of the shielding material of each of the plurality of shielding units of the shielding layer gradually decreases from the central part to the peripheral part, or the content of the shielding material of the central part is greater than the content of the shielding material of the peripheral part.

15. The mask of claim 13, further comprising:
a film layer, wherein the shielding layer is located on a side of the film layer, the shielding layer is formed of a shielding material or a material containing the shielding material, and a thickness of each of the plurality of shielding units of the shielding layer gradually decreases from the central part to the peripheral part, or the thickness of the central part is greater than the thickness of the peripheral part.

16. The mask of claim 13, further comprising:
a film layer, wherein the shielding layer is located on a side of the film layer, the shielding layer is formed of a shielding material or a material containing the shielding material, and each of the plurality of shielding units of the shielding layer is smaller than a corresponding one of the plurality of first electrodes, and has a same size as the central portion of the surface of the corresponding one of the plurality of first electrodes, such that each of the plurality of shielding units shields the central portion of the surface of a corresponding one of the plurality of first electrodes but exposes the peripheral portion of the surface of the corresponding one of the plurality of first electrodes.

17. The mask of claim 13, wherein:
the shielding layer is formed of a material containing a shielding material, the plurality of shielding units of the shielding layer are constituted by a plurality of parts of the shielding layer, respectively, and a content of the shielding material of each of the plurality of shielding units of the shielding layer gradually decreases from the central part to the peripheral part, or the content of the shielding material of the central part is greater than the content of the shielding material of the peripheral part.

18. The mask of claim 14, wherein:
the shielding material comprises an ultraviolet ray absorbing material, or an oxygen plasma shielding material.

19. The mask of claim 14, wherein:
a material of the film layer comprises ethylene-vinyl acetate copolymer.

* * * * *